US012387917B2

(12) United States Patent
Yanagi et al.

(10) Patent No.: US 12,387,917 B2
(45) Date of Patent: Aug. 12, 2025

(54) PLASMA PROCESSING APPARATUS AND PLASMA PROCESSING METHOD

(71) Applicant: Tokyo Electron Limited, Tokyo (JP)

(72) Inventors: Yoshihiro Yanagi, Miyagi (JP); Hiroki Endo, Miyagi (JP); Tong Wu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 181 days.

(21) Appl. No.: 18/215,859

(22) Filed: Jun. 29, 2023

(65) Prior Publication Data

US 2024/0006165 A1 Jan. 4, 2024

(30) Foreign Application Priority Data

Jun. 29, 2022 (JP) ................................ 2022-104289

(51) Int. Cl.
*H01J 37/32* (2006.01)

(52) U.S. Cl.
CPC .. *H01J 37/32715* (2013.01); *H01J 37/32174* (2013.01); *H01J 37/32568* (2013.01); *H01J 37/32935* (2013.01)

(58) Field of Classification Search
None
See application file for complete search history.

(56) References Cited

U.S. PATENT DOCUMENTS 9,601,301 B2 3/2017 Belostotskiy et al.
10,665,416 B2 * 5/2020 Kubota .................. H01J 37/06
10,720,313 B2 * 7/2020 Sato ................. H01J 37/32926
10,910,246 B2 * 2/2021 Chito .................. H01L 21/6833
12,205,801 B2 * 1/2025 Saijo ................ H01J 37/32642
12,207,362 B2 * 1/2025 Lee ........................ H05B 3/283
2002/0159276 A1 * 10/2002 Deboy ............. H02M 3/33507 363/20

* cited by examiner

*Primary Examiner* — Kenneth B Wells
(74) *Attorney, Agent, or Firm* — XSENSUS LLP

(57) ABSTRACT

A plasma processing apparatus includes a plasma processing chamber; a base; an electrostatic chuck; a plurality of electrode layers disposed in the same plane within the electrostatic chuck; a switch group including a plurality of first switches electrically connected to the electrode layers, respectively; a power supply and a measurement unit that are electrically connected to the switch group; a second switch that selects either the power supply or the measurement unit as a connection destination of the switch group; and a controller. The power supply includes a power source that supplies a power to the electrode layers. The measurement unit includes a resistor and a voltmeter that measures a voltage applied to the resistor. The controller is capable of executing a control operation that includes switching the connection destination of the switch group to the measurement unit and then turning ON the plurality of first switches one by one.

10 Claims, 5 Drawing Sheets

62a
13
PM
62b
W
62b
52
11
100
50
62
60
66
64
31
102
RF filter
124
132
110
V
130
106
104
122
120
heater control panel

PLASMA PROCESSING APPARATUS AND PLASMA PROCESSING METHOD

CROSS-REFERENCE TO RELATED APPLICATION

The present application is based on and claims priority from Japanese Patent Application No. 2022-104289, filed on Jun. 29, 2022, with the Japan Patent Office, the disclosure of which is incorporated herein in its entirety by reference.

TECHNICAL FIELD

The present disclosure relates to a plasma processing apparatus and a plasma processing method.

BACKGROUND

U.S. Pat. No. 9,601,301 discloses a method of applying a voltage to an electrode used for clamping a substrate embedded into an electrostatic chuck and determining a self-bias voltage $V_{dc}$ on the basis of the resulting current flowing through the electrode.

SUMMARY

According to an aspect of the present disclosure, a plasma processing apparatus includes a plasma processing chamber; a base disposed in the plasma processing chamber; an electrostatic chuck disposed on top of the base; a plurality of electrode layers disposed in the same plane within the electrostatic chuck; a switch group including a plurality of first switches electrically connected to the plurality of electrode layers, respectively; a power supply and a measurement unit that are electrically connected to the switch group; a second switch configured to select either the power supply or the measurement unit as a connection destination of the switch group; and a controller. The power supply includes a power source that supplies a power to the plurality of electrode layers. The measurement unit includes a resistor and a voltmeter that measures a voltage applied to the resistor. The controller is capable of executing a control operation that includes switching the connection destination of the switch group to the measurement unit and then turning ON the plurality of first switches constituting the switch group one by one.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
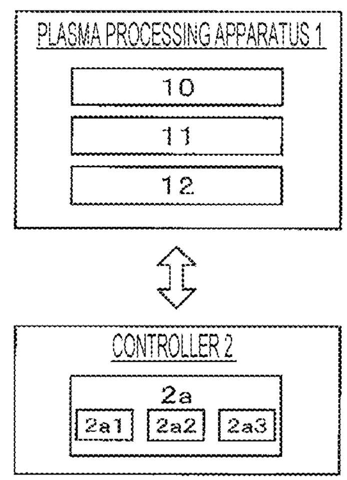
FIG. 1 is a diagram illustrating an exemplary configuration of a plasma processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In the semiconductor device manufacturing process, various plasma processing processes are performed to generate plasma from a desired processing gas in a processing module in which a semiconductor wafer (hereinafter referred to as "substrate") is accommodated therein to perform a desired processing on the substrate using the plasma. With the miniaturization of semiconductor devices, a plasma processing that achieves a high aspect ratio becomes more important. In order to achieve a high aspect ratio, a method of increasing the ion energy by increasing the bias voltage of a substrate support has been proposed. However, increasing the bias voltage may raise the likelihood of the occurrence of arcing, even leading to impairment of plasma stability and uniformity. Thus, to prevent arching and enhance plasma stability and uniformity, it is desirable to control a bias voltage by continuously detecting a self-bias voltage included in a bias voltage. Further, it is desirable to measure the in-plane distribution of the self-bias voltage to predict the distribution of etching characteristics.

In order to solve such problems, a method has been proposed in the related art, in which an electrode is provided inside the electrostatic chuck and the self-bias voltage is constantly monitored by measuring the voltage applied to the electrode. Further, U.S. Pat. No. 9,601,301 discloses a technique that applies a voltage to an electrode used for clamping and calculates a self-bias voltage on the basis of the resulting current flowing through the electrode.

However, according to the method in the related art, it is necessary to change the design to incorporate an additional electrode inside the electrostatic chuck. Such a design change for an existing apparatus is difficult in terms of affecting the temperature adjustment by a heater or a heat transfer medium. Further, U.S. Pat. No. 9,601,301 does not disclose a technique for measuring the in-plane distribution of the self-bias voltage, nor does it suggest predicting an in-plane distribution of etching characteristics.

Thus, the technology according to the present disclosure measures an in-plane distribution of a self-bias voltage of a substrate support. Specifically, the technology has an exemplary configuration with a heater electrode layer including a plurality of heater elements inside an electrostatic chuck of a substrate support and a measurement unit that measures the voltage of each heater element. The technology performs an operation of measuring the voltage for each heater element and calculating a self-bias voltage in respective regions of the substrate support that correspond to respective heater elements on the basis of the measured voltage.

Hereinafter, a configuration of a plasma processing apparatus according to the present embodiment will be described with reference to the drawings. The same reference numerals are herein used to indicate the same functional components and repetitive descriptions may be omitted for brevity.

<Plasma Processing System>

FIG. 1 is a diagram illustrating an exemplary configuration of a plasma processing system. In one embodiment, the plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber also has at least one gas supply port for delivering at least one processing gas into the plasma processing space and at least one gas discharge port for exhausting gas from the plasma processing space. The gas supply port is connected to a gas-supplying unit 20, which will be described later, while the gas discharge port is connected to an exhaust system 40, which will be described later. The substrate support 11 is disposed inside the plasma processing space and has a substrate-supporting surface used for supporting the substrate.

The plasma generator 12 generates plasma from at least one processing gas supplied into the plasma processing space. Examples of plasma that may be generated in the plasma processing space include capacitively coupled plasma (CCP), inductively coupled plasma (ICP), electron cyclotron resonance (ECR) plasma, helicon wave excited plasma (HWP), surface wave plasma (SWP), or other forms of plasma. Further, the plasma generator may be of various types, such as an alternating current (AC) plasma generator and a direct current (DC) plasma generator. In one specific embodiment, the AC plasma generator uses an AC signal (AC power) with a frequency ranging from 100 kHz to 10 GHz. Thus, the AC signal includes radio frequency (RF) signals and microwave signals. In one embodiment, the RF signal has a frequency within the range of 100 kHz to 150 MHz.

The controller 2 processes computer-executable instructions, which cause the plasma processing apparatus 1 to perform various processing described in the present disclosure. The controller 2 is capable of controlling the respective components of the plasma processing apparatus 1, enabling the components to perform various processing described herein. In one specific embodiment, the entirety or a part of the controller 2 may be included in the plasma processing apparatus 1. The controller 2 may include a processor 2_a_1, a storage unit 2_a_2, and a communication interface 2_a_3. The controller 2 is implemented by, for example, a computer 2_a_. The processor 2_a_1 may read and execute a program from the storage unit 2_a_2, enabling the performance of various control operations. The program may be pre-stored in the storage unit 2_a_2 or retrieved from a medium as needed. Once retrieved, the program is stored in the storage unit 2_a_2 and then loaded from the storage unit 2_a_2 by the processor 2_a_1 for execution. Examples of the medium include various storage media that are readable by the computer 2_a_ and a communication line that may be connected to the communication interface 2_a_3. The processor 2_a_1 may be a central processing unit (CPU). The storage unit 2_a_2 may include random-access memory (RAM), read-only memory (ROM), hard disk drive (HDD), solid-state drive (SSD), or a combination thereof. The communication interface 2_a_3 may facilitate communication with the plasma processing apparatus 1 over a communication line such as a local area network (LAN).

<Plasma Processing Apparatus>

Figure 2:
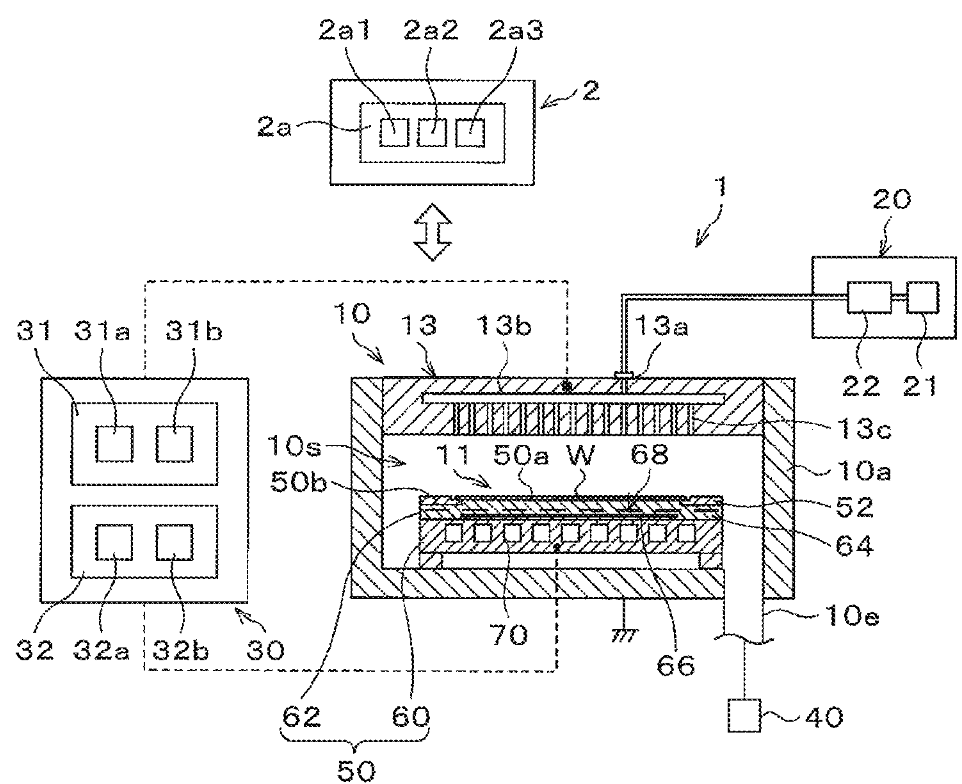
FIG. 2 is a cross-sectional view illustrating an exemplary configuration of a plasma processing apparatus according to an embodiment.

Hereinafter, descriptions will be made on an exemplary configuration of a capacitively coupled plasma processing apparatus as an example of the plasma processing apparatus 1. FIG. 2 is a diagram illustrating an exemplary configuration of the capacitively coupled plasma processing apparatus 1.

The capacitively coupled plasma processing apparatus 1 includes a plasma processing chamber 10, a gas-supplying unit 20, a power source 30, and an exhaust system 40. Further, the plasma processing apparatus 1 includes a gas inlet and a substrate support 11. The gas inlet introduces at least one processing gas into the plasma processing chamber 10. The gas inlet includes a showerhead 13. The substrate support 11 is disposed in the plasma processing chamber 10. The showerhead 13 is disposed above the substrate support 11. In one specific embodiment, the showerhead 13 forms at least a portion of the ceiling of the plasma processing chamber 10. The plasma processing chamber 10 has a plasma processing space 10_s_ that is defined by the showerhead 13, a side wall 10_a_ of the plasma processing chamber 10, and the substrate support 11. The plasma processing chamber 10 is grounded, while the showerhead 13 and the substrate support 11 are electrically insulated from the housing of the plasma processing chamber 10.

The substrate support 11 includes a body portion 50 and a ring assembly 52. The body portion 50 has a central region 50_a_, which supports a substrate W, and an annular region 50_b_, which supports the ring assembly 52. An example of the substrate W is a wafer. In plan view, the annular region 50_b_ of the body portion 50 encircles the central region 50_a_ of the body portion 50. The substrate W is disposed on the central region 50_a_ of the body portion 50. The ring assembly 52 is disposed on the annular region 50_b_ of the body portion 50 to encircle the substrate W disposed on the central region 50_a_ of the body portion 50. Thus, the central region 50_a_ is also referred to as a substrate-supporting surface used for supporting the substrate W, while the annular region is also referred to as a ring-supporting surface used for supporting the ring assembly 52.

In one embodiment, the body portion 50 includes a base 60 and an electrostatic chuck 62. The base 60 includes a conductive member. The conductive member of the base 60 may function as a lower electrode. The electrostatic chuck 62 is disposed on the base 60. The electrostatic chuck 62 includes a ceramic member 64, a clamping electrode layer 66 disposed inside the ceramic member 64, and a heater electrode layer 68. The heater electrode layer 68 is disposed on top of the clamping electrode layer 66. The heater electrode layer 68 will be described in detail later. The ceramic member 64 has the central region 50_a_. In one specific embodiment, the ceramic member 64 also has the annular region 50_b_. The annular region 50_b_ may be included in another member that encircles the electrostatic chuck 62, such as an annular electrostatic chuck or an annular insulating member. In this configuration, the ring assembly 52 may be disposed on either the annular electrostatic chuck or the annular insulating member, or on both the electrostatic chuck 62 and the annular insulating member. Furthermore, at least one RF-DC electrode coupled to an RF power source 31 and/or a DC power source 32, as described later, may be disposed inside the ceramic member 64. In this case, at least one RF-DC electrode functions as a lower electrode. When a bias RF signal and/or a DC signal, as described later, is applied to at least one RF-DC electrode, the RF-DC electrode is also referred to as a bias electrode. The conductive member of the base 60 and at least one RF-DC electrode may function as multiple lower electrodes. Alternatively, the clamping electrode layer 66 may function as a lower electrode. Consequently, the substrate support 11 includes at least one lower electrode.

The ring assembly 52 includes one or more annular members, which, in a specific embodiment, have one or more edge rings and at least one cover ring. The edge ring is made of a conductive or insulating material, while the cover ring is made of an insulating material.

Further, the substrate support 11 includes a temperature regulation module, which controls the temperature of at least one of the electrostatic chuck 62, the ring assembly 52, or the substrate W to a target temperature. The temperature regulation module may include the heater electrode layer 68, heat transfer medium, a flow path 70, or combinations thereof. Heat transfer fluids, like brine or gas, flow through the flow path 70. In one specific embodiment, the flow path 70 is formed inside the base 60. Furthermore, the substrate support 11 may include a heat transfer gas-supplying unit that supplies the gap between the back surface of the substrate W and the central region 50*a* with a heat transfer gas.

The showerhead 13 introduces at least one processing gas from the gas-supplying unit 20 into the plasma processing space 10*s*. The showerhead 13 has at least one gas supply port 13*a*, at least one gas diffusion chamber 13*b*, and a plurality of gas introduction ports 13*c*. The processing gas supplied to the gas supply port 13*a* flows through the gas diffusion chamber 13*b* and enters the plasma processing space 10*s* via the multiple gas introduction ports 13*c*. Further, the showerhead 13 also includes at least one upper electrode. The gas inlet may include one or more side gas injectors (SGIs) attached to one or more openings formed in the side wall 10*a*, in addition to the showerhead 13.

The gas-supplying unit 20 may include at least one gas source 21 and at least one flow controller 22. In one embodiment, the gas-supplying unit 20 delivers at least one processing gas to the showerhead 13 from the corresponding gas sources 21 through the corresponding flow controllers 22. The flow controllers 22 may each include, for example, a mass flow controller or a pressure-controlled flow controller. Further, the gas-supplying unit 20 may further include at least one flow modulation device used to modulate or pulse the flow rate of at least one processing gas.

The power source 30 includes an RF power source 31 that is coupled to the plasma processing chamber 10 via at least one impedance-matching circuit. The RF power source 31 supplies at least one lower electrode and/or at least one upper electrode with at least one RF signal (or RF power). This configuration allows the production of plasma from at least one processing gas supplied to the plasma processing space 10*s*. Thus, the RF power source 31 may function as at least a part of the plasma generator 12. Furthermore, supplying a bias RF signal to at least one lower electrode enables the generation of a bias voltage $V_B$ in the substrate W, which draws ion components in the produced plasma into the substrate W. The bias voltage $V_B$ will be described in detail later.

In one embodiment, the RF power source 31 includes a first RF generator 31*a* and a second RF generator 31*b*. The first RF generator 31*a* is coupled to at least one lower electrode and/or at least one upper electrode via at least one impedance-matching circuit to generate a source RF signal (or source RF power) for plasma production. In one specific embodiment, the source RF signal has a frequency within the range of 10 MHz to 150 MHz. In one specific embodiment, the first RF generator 31*a* may generate multiple source RF signals with different frequencies. The generated one or more source RF signals are delivered to at least one lower electrode and/or at least one upper electrode.

The second RF generator 31*b* is coupled to at least one lower electrode via at least one impedance-matching circuit to generate the bias RF signal (or bias RF power). The frequency of the bias RF signal may be the same as or different from the frequency of the source RF signal. In one embodiment, the bias RF signal has a frequency lower than the frequency of the source RF signal. In one specific embodiment, the bias RF signal has a frequency within the range of 100 kHz to 60 MHz. In one specific embodiment, the second RF generator 31*b* may generate multiple bias RF signals with different frequencies. The generated one or more bias RF signals are delivered to at least one lower electrode. Further, in some embodiments, at least one of the source RF signal and the bias RF signal may be pulsed.

Further, the power source 30 may include a direct current (DC) power source 32 that is coupled to the plasma processing chamber 10. The DC power source 32 includes a first DC generator 32*a* and a second DC generator 32*b*. In one embodiment, the first DC generator 32*a* is connected to at least one lower electrode to generate a first DC signal. The generated first DC signal is applied to at least one lower electrode. In one specific embodiment, the second DC generator 32*b* is connected to at least one upper electrode to generate a second DC signal. The generated second DC signal is applied to at least one upper electrode.

In various embodiments, the first and second DC signals may be pulsed, in which case a sequence of voltage pulses is applied to at least one lower electrode and/or at least one upper electrode. The voltage pulses may have pulse waveforms such as rectangular, trapezoidal, triangular, or combinations thereof. In one embodiment, a waveform generator, which generates a sequence of voltage pulses from the DC signal, may be connected between the first DC generator 32*a* and at least one lower electrode. Thus, the first DC generator 32*a* and the waveform generator constitute a voltage pulse generator. When the second DC generator 32*b* and the waveform generator constitute the voltage pulse generator, the voltage pulse generator may be connected to at least one upper electrode. The voltage pulse may have either a positive or negative polarity. Further, the sequence of voltage pulses may include one or more positive voltage pulses and one or more negative voltage pulses in one cycle. The first and second DC generators 32*a* and 32*b* may be provided in addition to the RF power source 31, and the first DC generator 32*a* may be provided instead of the second RF generator 31*b*.

Here, a self-bias voltage $V_{dc}$ generated in the substrate support 11 will be described. As previously described, in the case where the plasma processing apparatus 1 is supplied with the source RF signal, the gas introduced into the plasma processing space 10*s* is ionized into electrons and positive ions, producing the plasma PM. During this process, electrons, which have a small mass, move in the plasma processing space 10*s* following the variations in high-frequency voltages of the source RF signal and flow into the lower electrode, which is the substrate support 11. Meanwhile, the positive ions, with their larger mass, are unable to respond to the variations in high-frequency voltages of the source RF signal, causing most of them to remain in the plasma processing space 10*s*. This results in the substrate support 11 being negatively charged relative to the plasma processing space 10*s*. The voltage of the substrate support 11 in this condition is referred to as the self-bias voltage $V_{dc}$.

Figure 3:
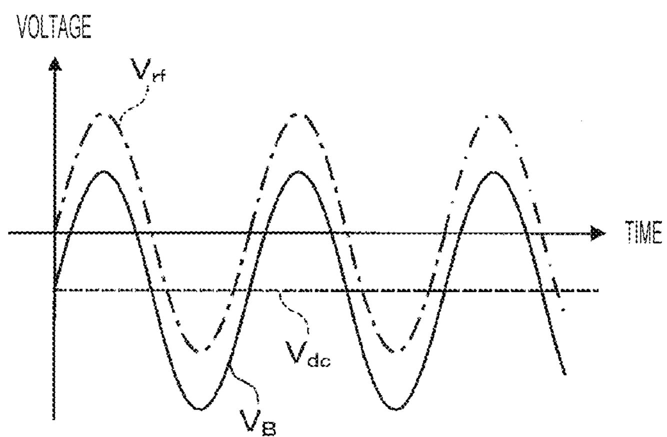
FIG. 3 is a graph illustrating the relationship between a bias voltage, self-bias voltage, and bias RF signal.

In one embodiment, the bias RF signal is supplied to the lower electrode. FIG. 3 is a graph illustrating an example of the variation in the bias voltage $V_B$ over time during the application of the bias RF signal. The solid line represents the bias voltage $V_B$, the dotted line represents the self-bias voltage $V_{dc}$, and the alternating long and short dashed line represents a bias RF signal voltage $V_{rf}$. In the example of FIG. 3, the bias voltage $V_B$ equals the sum of the self-bias voltage $V_{dc}$ and the bias RF signal voltage $V_{rf}$. In other words, the graph of the bias voltage $V_B$ may be obtained by offsetting the graph of the bias RF signal voltage $V_{rf}$ by the self-bias voltage $V_{dc}$ in the negative direction.

The exhaust system 40 may be connected to, for example, a gas discharge port that is provided at the bottom of the plasma processing chamber 10. The exhaust system 40 may include a pressure regulating valve and a vacuum pump. The pressure regulating valve controls the pressure in the plasma processing space 10*s*. The vacuum pumps may include turbomolecular pumps, dry pumps, or a combination of both.

Figure 4:
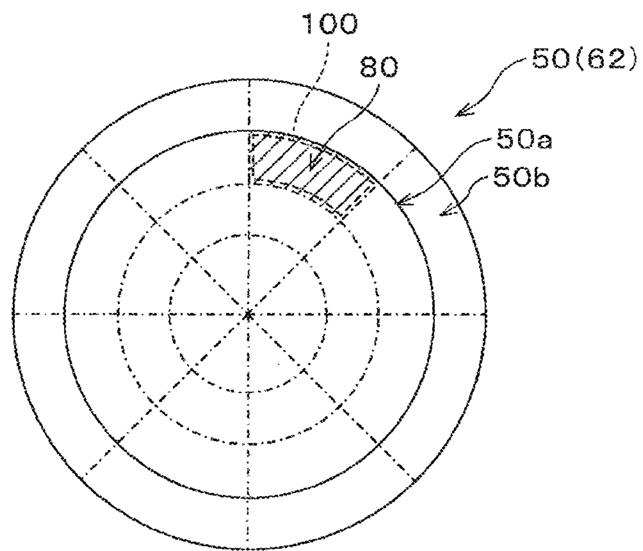
FIG. 4 is a top plan view schematically illustrating segmented regions of an electrostatic chuck according to an embodiment.

Next, the body portion 50 of the substrate support 11 will be described in detail. FIG. 4 is a top plan view illustrating an overview of the structure of the body portion 50 in the substrate support 11 according to the present embodiment.

In FIG. 4, only the electrostatic chuck 62 is depicted of the main body 50 in the substrate support 11. The electrostatic chuck 62 in the body portion 50 includes the central region 50*a* and the annular region 50*b*, as previously described. The central region 50*a* is surrounded by the inner circle of circles represented by solid lines, and the annular region 50*b* is sandwiched between the inner and outer circles of circles represented by solid lines.

The central region 50*a* and the annular region 50*b* are segmented into multiple regions, one of which is called a segmented region 80. In the figure, the central region 50*a* and the annular region 50*b* are radially segmented by straight lines and concentric circles represented by the alternating long and short dashed lines. The hatched portion represents one of the segmented regions 80, which are segmented as described above. All of the regions segmented in the same way as the manner described above are segmented regions 80, like the hatched region 80, but their hatching and reference numerals are omitted for clarity. Moreover, such segmentation is made for convenience only and does not imply physical separation. The segmented regions 80 are provided with their respective corresponding heater elements 100, which are multiple heater electrode layers included in the heater electrode layer 68. Moreover, each of the multiple heater electrode layers included in the heater electrode layer 68 is herein referred to as the heater element 100 to avoid duplication of component naming. In the figure, the segmented region 80, which is represented by hatching, is provided with one corresponding heater element 100, which is represented by dotted lines. Each of the multiple heater elements 100 is one of the electrodes that form part of the heater electrode layer 68. Furthermore, the multiple heater elements 100 are embedded in the electrostatic chuck 62 near their respective corresponding segmented regions 80 and are all provided in the same plane. The multiple heater elements 100 are supplied with alternating current (AC) to heat their respective corresponding segmented regions 80. In the figure, only one of the multiple heater elements 100 is depicted, and other heater elements 100 corresponding to other segmented regions 80 are omitted for clarity, as they are identical. The segmented region 80 may have shapes other than the example illustrated in the figure. Both the central region 50*a* and the annular region 50*b* may be segmented into a plurality of regions with different shapes. In this case, only the central region 50*a* may be segmented into a plurality of regions, and the annular region 50*b* may be segmented into a plurality of regions with an undivided shape. Further, the shape of the heater element 100 is not limited to the example illustrated in the figure. The heater elements 100 may have a shape and quantity that corresponds to the segmented region 80.

Figure 5:
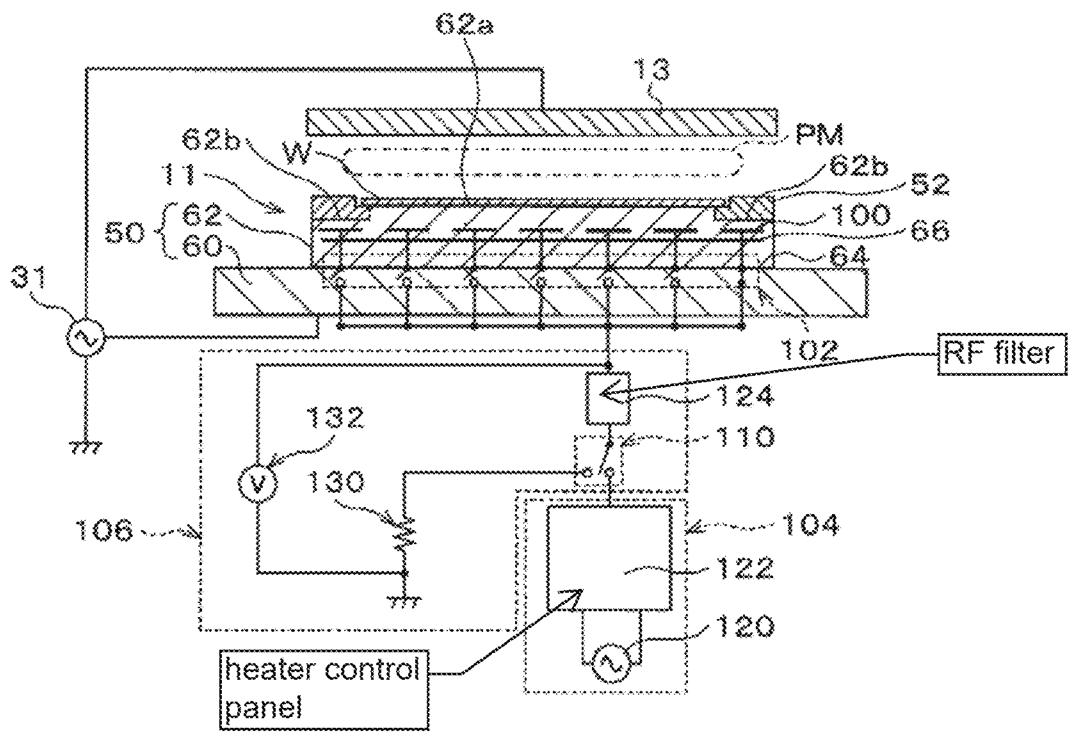
FIG. 5 is a cross-sectional view schematically illustrating electrical connection in a substrate support according to an embodiment.

FIG. 5 is a cross-sectional view of a part of the plasma processing apparatus 1, illustrating the overview of the configuration of electrical connections in the substrate support 11. However, for the sake of clarity, any illustrations of the configuration that is unnecessary for the description of the electrical connection in the substrate support 11 are omitted. The phrase "electrical connection" as used herein refers to the connection of one component to another component to form an electric circuit. This connection may be made via a conductor such as a wire, or it may be made wirelessly by coupling an electric field or a magnetic field. The connection may be established directly, meaning that there are no other components between the connected components, or indirectly, signifying that there are other components between the connected components. In some cases, the electrical connection may be simply referred to as "connected" without the use of the term "electrical." In addition, the condition where one component is electrically connected to another component is defined as the "on" state for the other component, while the condition where one component is not connected is similarly defined as the "off" state. Further, for a component with a connection state that may be switched on or off using a switch described later, the state of the switch that turns on the component is defined as the "on" state of the switch, while the state of the switch that turns off the component is defined as the "off" state of the switch.

In FIG. 5, the multiple heater elements 100 are electrically connected individually to a power supply 104 or a measurement unit 106 via a switch group that includes a plurality of first switches 102. The first switches 102 are capable of switching on or off the connection of their respective corresponding heater elements 100 to the power supply 104 or the measurement unit 106. In the example of FIG. 5, only the first switch associated with the heater element 100 illustrated on the far right is turned on, while the first switches associated with all other heater elements 100 are turned off. The first switches 102 allow for turning on or off all of the heater elements 100 and, furthermore, allow for turning on a predetermined number of heater elements 100 among the plurality of heater elements 100 while turning off the remaining ones. Specifically, the first switch 102 may be a relay that is capable of being controlled by the controller 2 to switch on or off using an electric signal.

The power supply 104 and the measurement unit 106 are electrically connected to the plurality of heater elements 100 via a second switch 110. The second switch 110 is capable of switching on or off the connection of the power supply 104 and the measurement unit 106 to the multiple heater elements 100. In other words, the second switch selects one of the power supply 104 or the measurement unit 106 as the connection destination for the plurality of first switches and switches the connection to the selected one. The second switch 110 allows for switching between turning on the power supply 104 and turning off the measurement unit 106, between turning off the power supply 104 and turning on the measurement unit 106, or between turning off both units simultaneously. In the example of FIG. 5, both the power supply 104 and the measurement unit 106 are off, that is, in a floating state. Specifically, the second switch 110 may be a relay that is capable of being controlled by the controller 2 to switch on or off using an electric signal.

In one example, there may be provided a configuration where all of the first switches 102 are simultaneously turned on, while the second switch 110 turns on the power supply 104 and turn off the measurement unit 106. This configuration enables the first switches 102 and the second switches 110 to connect all of the heater elements 100 to the power supply 104. Further, in one example, a configuration may also be provided, in which only one of the first switches 102 is turned on, all the other remaining first switches 102 are turned off, the second switch 110 turns on the measurement unit 106, and turns off the power supply 104. This configuration makes it possible to connect only one of the heater elements 100 to the measurement unit 106. In addition to the configurations described above, it is possible to connect any one or all of the heater elements 100 to any desired combination of either the power supply 104 or the measurement unit 106.

The power supply 104 includes a heater power source 120, which delivers electric power to the heater electrode layer 68, and a heater control panel 122. The heater control panel 122 controls power feeding supplied from the heater power source 120. In one example, the controller 2 may control the heater control panel 122 using an electrical signal, allowing it to control power feeding supplied from the heater power source 120.

There is provided an RF filter 124 between the power supply 104 and the plurality of first switches 102. During plasma production, RF noise originating from high-frequency power supplied from the RF power source 31 may sometimes enter the power supply 104 through the heater electrode layer 68. The RF noise that reaches the heater power source 120 may impair its operation or performance of the heater power source 120 or cause high-frequency power consumption in the heater electrode layer 68, which may lead to a reduction in the efficiency of plasma production. The RF filter 124 is responsible for attenuating or blocking such RF noise to protect the power supply 104. Thus, any known filter capable of attenuating or blocking an alternating current at a predetermined frequency may be used as the RF filter 124. Specifically, examples of such filters may include a coil, a capacitor or a resistor, or a combination thereof.

The measurement unit 106 includes the RF filter 124, a resistor 130, and a voltmeter 132 that measures the voltage applied to the resistor 130. In the measurement unit 106, the RF filter 124 removes the impact of RF noise from the voltage measured by the voltmeter 132. In other words, the voltmeter 132 may measure a voltage from which RF noise has been removed. In addition, the measurement unit 106 is capable of transmitting the voltage measured by the voltmeter 132 to the controller 2 and recording the value of the voltage.

<Plasma Processing Method>

Figure 6:
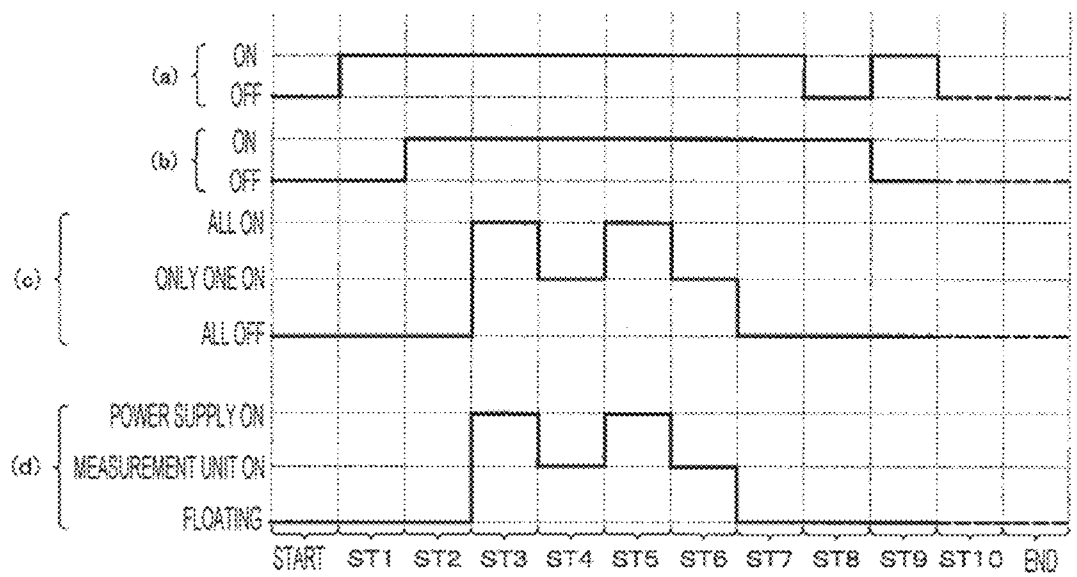
FIG. 6 is a sequence diagram illustrating an overview of a plasma processing method according to an embodiment.
Figure 7:
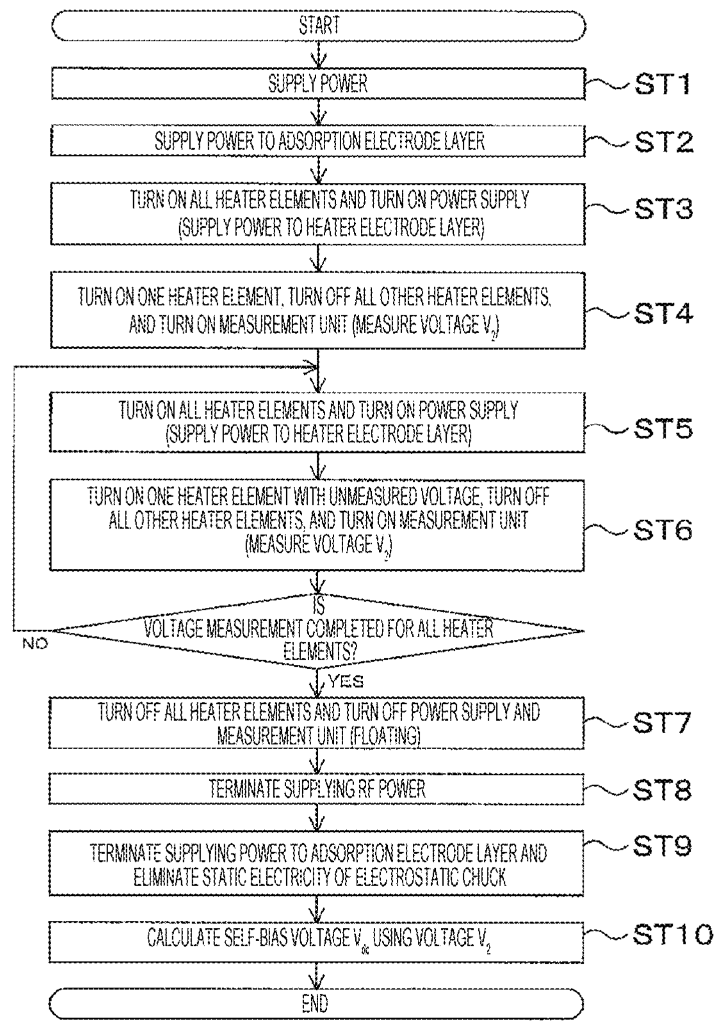
FIG. 7 is a flowchart illustrating an overview of the plasma processing method according to an embodiment.

Next, descriptions will be made on a plasma processing method MT that is implementable in the plasma processing apparatus 1 described above. In the plasma processing method MT, the self-bias voltage $V_{dc}$ of the substrate support 11 upon plasma production is calculated for each of the segmented regions 80. Specifically, steps ST1 to ST9 described below are executed sequentially to connect the heater elements 100 corresponding to the respective segmented regions 80 to the measurement unit 106 one by one, causing it to measure a voltage $V_2$ for each of the heater elements 100. Subsequently, step ST10 performs the operation on the basis of the voltage $V_2$ to calculate the self-bias voltage $V_{dc}$ in the segmented region 80. FIGS. 6 and 7 illustrate an example of the processing procedure of the plasma processing method MT according to the present embodiment in the form of a sequence diagram (FIG. 6) and a flowchart (FIG. 7).

In FIG. 6, in part (a), "on" or "off" refers to whether or not the RF power is supplied from the RF power source 31 in a time series. In part (b), "on" or "off" refers to whether or not power is supplied to the clamping electrode layer 66, which acts as the lower electrode in a time series. In part (c), "all on," "only one on," or "all off" refers to whether the first switches 102 are turned on or off in a time series. In part (d), "power supply on," "measurement unit on," or "floating" refers to the state where the power supply 104 or the measurement unit 106 is turned on or both are turned off (floating) by the second switch in a time series. When the power supply 104 is turned on, the measurement unit 106 is turned off, and vice versa when the measurement unit 106 is on, the power supply 104 is turned off.

In FIGS. 6 and 7, the plasma processing method MT starts with the following initial states: no RF power is supplied, no power is supplied to the clamping electrode layer 66, the first switches 102 are all off, and the second switch 110 is in a floating state. Moreover, upon the start, it is assumed that the substrate W is loaded into the plasma processing chamber 10 in advance and disposed on the substrate support 11.

In step ST1, a specific gas for plasma production is introduced, and subsequently the RF power is supplied. The RF power includes at least a source RF signal for plasma production, producing plasma PM in the plasma processing space 10*s*. Furthermore, the RF power may also include a bias RF signal that attracts plasma ions towards the substrate W. The bias RF signal may be supplied prior to, after, or simultaneously with the application of the source RF signal.

In step ST2, power is supplied to the clamping electrode layer 66. This causes the substrate W to be attracted to an upper surface 62*a* of the electrostatic chuck 62. Once the substrate W is attracted, a heat transfer medium may be supplied to the gap between the back surface of the substrate W and the central region 50*a*.

In step ST3, power is supplied to the heater electrode layer 68. Specifically, the first switches 102 are all turned on, and the power supply 104 is turned on through the second switch 110. This enables the connection of all the heater elements 100 to the power supply 104, allowing alternating current (AC) power to be supplied from the heater power source 120 to all the heater elements 100.

In step ST4, one of the heater elements 100 is turned on, and its voltage $V_2$ is measured by the measurement unit 106. Specifically, among the plurality of first switches 102 all turned on in step ST3, only one intended first switch remains on, while all other first switches 102 are turned off. Simultaneously, the measurement unit 106 is turned on through the second switch 110. This causes only one heater element 100 corresponding to the first switch 102 turned on to be connected to the measurement unit 106. In the measurement unit 106, the voltmeter 132 measures the voltage $V_2$ applied to the resistor 130.

In step ST5, power is supplied to the heater electrode layer 68. Specifically, this step is similar to step ST3.

In step ST6, one of the heater elements 100 for which voltage has not been measured is turned on, and the voltage $V_2$ is measured in the measurement unit 106. The one heater element 100 for which voltage has not been measured is the heater element 100 other than the one heater element 100 for which the voltage $V_2$ has been measured in step ST4 and specifically, is the heater element 100 for which the voltage $V_2$ has not yet been measured even in the case where step ST6 is repeatedly performed, as will be described later. In step ST6, only the first switch 102 corresponding to the one heater element 100 for which voltage has not been measured is turned on, while all the other first switches 102 are turned off. Simultaneously, the measurement unit 106 is turned on through the second switch 110. This allows only one heater element 100, which has not had its voltage measured, to be connected to the measurement unit 106. In the measurement unit 106, the voltage $V_2$ applied to the resistor 130 is measured by the voltmeter 132. The heater element 100 for which the voltage $V_2$ has been measured in step ST6 is not included in the heater element 100, which has not had its voltage measured.

After step ST6, it is determined whether the voltage measurement for all the heater elements 100 is completed. When the voltage measurement for all the heater elements 100 is not completed, and thus, there are one or more heater elements 100 for which voltage measurement is not performed, steps ST5 and ST6 are then performed again. This causes step ST6 to be repeatedly performed, which reduces the number of the heater elements 100 with unmeasured voltage. When the voltage measurement is finally completed for all the heater elements 100 and there is no heater element 100 with unmeasured voltage, then the process proceeds to step ST7.

In step ST7, all the heater elements 100 are turned off through the first switch 102, and the power supply 104 and the measurement unit 106 are both turned off (floating) through the second switch 110.

In step ST8, the supply of RF power is terminated. In step ST9, static electricity is eliminated from the surface of the electrostatic chuck 62 and the substrate W, and then the supply of power to the clamping electrode layer 66 is terminated.

In step ST10, the operation is performed to calculate the self-bias voltage $V_{dc}$ for each segmented region 80 on the basis of the voltage $V_2$ measured for each heater element 100. In the examples depicted in FIGS. 6 and 7, step ST10 is executed after step ST9, and the operations based on the voltage Vz measured for all the heater elements 100, which is obtained in steps ST4 and ST6, are collectively carried out, but are not limited to this exemplary procedure. In one instance, step ST10 may be performed immediately after measuring the voltage Vz in steps ST4 and ST6. The operation mentioned above may be performed in the controller 2 by causing the measurement unit 106 to transmit the value of the voltage $V_2$ to the controller 2.

Figure 8:
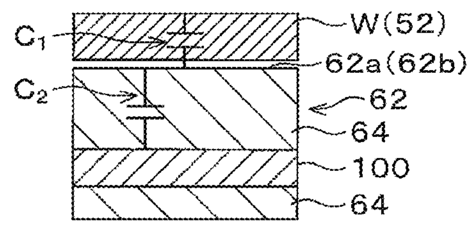
FIG. 8 is a cross-sectional view schematically illustrating the electrical relationship between a substrate, a ceramic member, and a heater element in the plasma processing method according to an embodiment.
Figure 9:
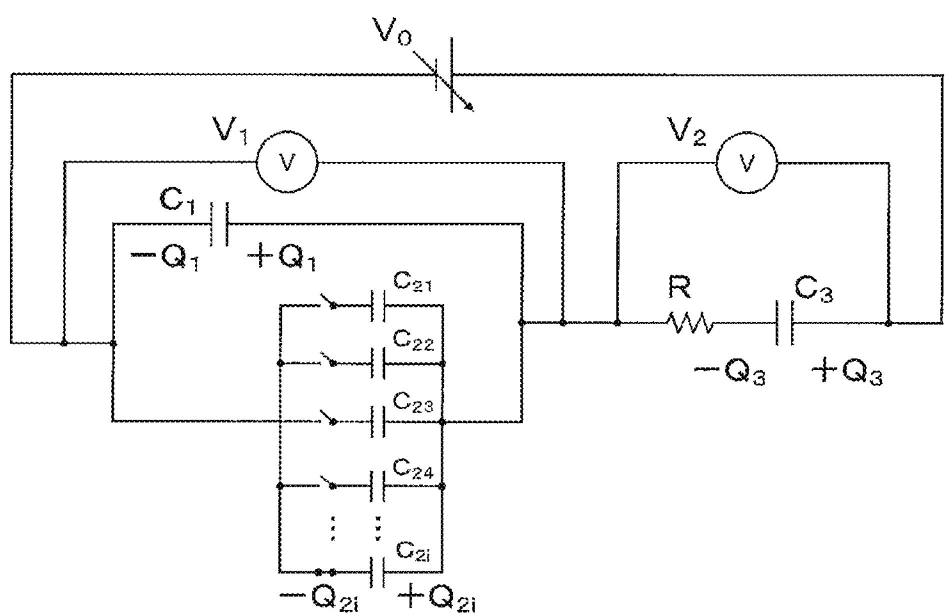
FIG. 9 is an equivalent circuit diagram schematically illustrating the electrical relationship between a substrate and a substrate support in the plasma processing method according to an embodiment.

Hereinafter, descriptions will be made on an operation executed in step ST10 with reference to FIGS. 8 and 9. FIG. 8 is a cross-sectional view schematically illustrating the electrical relationship between the substrate W, the ceramic member 64, and the heater element 100, in steps ST4 and ST6. FIG. 9 is an equivalent circuit for the substrate W and the substrate support 11 when the i-th heater element 100, which will be described later, is turned on and the measurement unit 106 is turned on, in steps ST4 and ST6.

In FIG. 8, parasitic capacitance exists both between the substrate W and the upper surface 62*a* of the electrostatic chuck 62 in the central region 50*a* and between the upper surface 62*a* and the heater element 100. This capacitance may be considered as equivalent to a capacitive element. The capacitance between the substrate W and the upper surface 62*a* of the electrostatic chuck 62 is designated as $C_1$, and the capacitance between the upper surface 62*a* of the electrostatic chuck 62 and the heater element 100 is designated as $C_2$. In this regard, assuming that the number i of the heater elements 100 is provided, the capacitance between the upper surface 62*a* of the electrostatic chuck 62 and the i-th heater element 100 is designated as $C_{2i}$. The capacitance values $C_1$ and $C_{2i}$ may be calculated as fixed values on the basis of design parameters, including the area, length (distance), and dielectric constant of each component of the substrate W, the upper surface 62*a* of the electrostatic chuck 62, the ceramic member 64, and the heater element 100.

In FIG. 9, the capacitance value $C_1$ and $C_{2i}$ are the capacitances between the substrate W and the upper surface 62*a* of the electrostatic chuck 62 and between the upper surface 62*a* and the i-th heater element 100, respectively, as illustrated in FIG. 8. The capacitance of the RF filter 124 in the measurement unit 106 when it is considered equivalent to a capacitive element is designated as $C_3$. The resistance value of the resistor 130 is designated as R. The sum of voltages in the equivalent circuit is designated as $V_0$. The voltage across the substrate W and the heater electrode layer 68 is designated as $V_1$. The voltage measured by the voltmeter 132 in step ST4 or ST6 is designated as $V_2$. The charge accumulated across the substrate W and the upper surface 62*a* of the electrostatic chuck 62 is designated as $Q_1$. The charge accumulated across the upper surface 62*a* of the electrostatic chuck 62 and the i-th heater element 100 is designated as $Q_{2i}$. The charge accumulated in the RF filter 124 is designated as $Q_3$.

The charges $Q_1$, $Q_{2i}$, and $Q_3$ in the equivalent circuit depicted in FIG. 9 satisfy the following relationship in accordance with the principle of charge conservation:

$$Q_1+Q_{2i}-Q_3=0$$

This equation may be reformulated as:

$$Q_1+Q_{2i}=Q_3 \tag{1}$$

The charges $Q_1$, $Q_{2i}$, and $Q_3$, voltages $V_1$ and $V_2$, and capacitances $C_1$, $C_{2i}$, and $C_3$ in the equivalent circuit depicted in FIG. 9 satisfy the following relationships.

$$Q_1+Q_{2i}=(C_1+C_{2i})*V_1 \tag{2}$$

$$Q_3=C_3*V_2 \tag{3}$$

By substituting Formulas (2) and (3) into Formula (1), Formula (4) for the relational expression between $V_1$ and $V_2$ is obtained as follows:

$$(C_1+C_{2i})*V_1=C_3*V_2$$

This expression may be reformulated as:

$$V_1=C_3/(C_1+C_{2i})*V_2 \tag{4}$$

The voltage $V_0$ in the equivalent circuit depicted in FIG. 9 is the sum of the voltages $V_1$ and $V_2$, given by the following equation:

$$V_0=V_1+V_2$$

By substituting Formula (4) into the above equation, the resulting equation is as follows:

$$V_0=C_3/(C_1+C_{2i})*V_2+V_2 \tag{5}$$

In this context, the voltage $V_0$ represents the voltage of the overall equivalent circuit depicted in FIG. 9 in the case where the i-th heater element 100 is turned on, and as well as it may be considered as the self-bias voltage $V_{dc}$ of the segmented region 80 corresponding to the i-th heater element 100. From this consideration and Formula (5), the resulting expression may be given as:

$$V_{dc}=C_3/(C_1+C_{2i})*V_2+V_2 \quad (6)$$

According to Formula (6), the self-bias voltage $V_{dc}$ of the segmented region 80 corresponding to the i-th heater element 100 may be expressed using the voltage $V_2$ measured by the measurement unit 106. In other words, in step ST10, the use of Formula (6) enables the computation of the self-bias voltage $V_{dc}$ of the segmented region corresponding to the i-th heater element 100 on the basis of the voltage $V_2$.

In steps ST4 and ST6, the voltage $V_2$ is measured for all the heater elements 100 from the first to the i-th heater elements. Thus, in step ST10, the self-bias voltage $V_{dc}$ may be calculated for the respective segmented regions 80 corresponding to all the heater elements 100 from the first to the i-th heater elements.

The preceding description gives the case where the i-th heater element 100 is the heater element 100 disposed in the central region 50*a* of the substrate support 11 facing the substrate W. Meanwhile, when the heater element 100 is located in the annular region 50*b* of the substrate support 11 facing the ring assembly 52, the self-bias voltage $V_{dc}$ may be calculated as described below. In other words, as illustrated in FIG. 8, the capacitance between the ring assembly 52 and the upper surface 62*b* of the electrostatic chuck 62 in the annular region 50*b* is designated as $C_1$, the voltage between the ring assembly 52 and the heater electrode layer 68 is designated as $V_1$, and the charge accumulated between the ring assembly 52 and the upper surface 62*b* of the electrostatic chuck 62 is designated as $Q_1$. Based on these details, the operation of step ST10 is executed.

According to the preceding disclosure, it is possible to calculate the self-bias voltage $V_{dc}$ for each of the segmented regions 80 of the substrate support 11 on the basis of the voltage $V_2$ measured for the respective heater elements 100. This configuration enables the use of the substrate support 11 provided with the heater electrode layer 68 including the plurality of heater elements 100 inside the electrostatic chuck 62, making it possible to measure the in-plane distribution of the self-bias voltage Vdc without necessitating any modifications to the internal structure of the electrostatic chuck 62. Furthermore, the use of the in-plane distribution of the self-bias voltage Vdc makes it possible to predict the in-plane etching characteristics of the substrate W.

Although the present embodiment exemplifies the substrate support 11 in the capacitively coupled plasma processing apparatus 1, the configuration of the present disclosure is not limited to this specific exemplary arrangement. Similar effects may be attained by employing a similar configuration for the substrate support 11 in the inductively coupled plasma processing apparatus 1.

Furthermore, in one example, in steps ST4 and ST6, the multiple heater elements 100 are turned on one by one to measure the voltage $V_2$ for each, but the configuration of the present disclosure is not limited to this specific exemplary arrangement. In other words, when the self-bias voltage $V_{dc}$ is expected to be identical for some of the plurality of segmented regions 80, the processing procedures described above may be carried out by simultaneously turning on the multiple heater elements 100 corresponding to the segmented regions 80 and turning off all other heater elements 100. In this case, the voltage $V_2$ measured by the measurement unit 106 may be considered as the average value of the voltages $V_2$ measured by executing the processing procedures with the heater elements 100 turned on one by one.

Further, in one example, although the measurement unit 106 is provided with the RF filter 124, the configuration of the present disclosure is not limited to this specific exemplary arrangement. Specifically, instead of the RF filter 124, an alternative component that may be considered equivalent to the capacitive element in the equivalent circuit in the example of FIG. 9 may be used. In this case, the operation of step ST10 may be performed by designating the capacitance of the component, when considered equivalent to the capacitive element, as $C_3$.

Further, the constituent components of the aforementioned embodiments may be combined in any various ways. Through such combinations, the inherent functions and effects of each constituent component in the combination may be obtained, along with other functions and effects that would be apparent to those skilled in the art on the basis of the description herein. Furthermore, the effects described herein are presented as illustrative examples and are not intended to be limiting. In other words, the technology disclosed in the present application is capable of producing additional effects, evident to those skilled in the art from the description herein, in addition to or instead of the aforementioned effects.

The following configuration is also within the technical scope of the present disclosure.

(1) A plasma processing apparatus including:

a plasma processing chamber;

a base disposed in the plasma processing chamber;

an electrostatic chuck disposed on top of the base;

a plurality of electrode layers disposed in the same plane within the electrostatic chuck;

a switch group including a plurality of first switches electrically connected to the plurality of electrode layers, respectively;

a power supply and a measurement unit that are electrically connected to the switch group;

a second switch configured to select either the power supply or the measurement unit as a connection destination of the switch group; and a controller, wherein the power supply includes a power source that supplies a power to the plurality of electrode layers, the measurement unit includes a resistor and a voltmeter that measures a voltage applied to the resistor, and the controller is configured to execute a control operation that includes switching the connection destination of the switch group to the measurement unit and then turning ON the plurality of first switches constituting the switch group one by one.

(2) The plasma processing apparatus according to the above (1), in which the measurement unit includes a capacitor disposed between the power supply and the switch group.

(3) The plasma processing apparatus according to the above (1) or (2), in which the electrode layer is a heater electrode layer.

(4) The plasma processing apparatus according to the above (1) or (2), in which the electrostatic chuck includes a clamping electrode layer, and the plurality of electrode layers is disposed on top of the clamping electrode layer.

(5) The plasma processing apparatus according to the above (1) or (2), in which the switch group is disposed inside the base.

(6) The plasma processing apparatus according to the above (2), in which the capacitor constitutes an RF filter.

(7) The plasma processing apparatus according to the above (1) or (2), in which the controller is configured to execute a control operation that includes switching the connection destination of the switch group to the power supply and turning on all of the plurality of switches constituting the switch group, followed by switching the connection destination of the switch group to the measurement unit and then turning on the plurality of first switches one by one.

(8) A plasma processing method including:

providing a plasma processing apparatus including:

a plasma processing chamber;

a base disposed in the plasma processing chamber;

an electrostatic chuck disposed on top of the base;

a plurality of electrode layers disposed in the same plane within the electrostatic chuck;

a switch group including a plurality of first switches electrically connected to the plurality of electrode layers, respectively;

a power supply and a measurement unit that are electrically connected to the switch group, the power supply including a power source that supplies a power to the plurality of electrode layers, and the measurement unit including a resistor and a voltmeter that measures a voltage applied to the resistor;

a second switch configured to select either the power supply or the measurement unit as a connection destination of the switch group; and a controller, switching the connection destination of the switch group to the measurement unit and then turning ON the plurality of first switches constituting the switch group one by one; and measuring the voltage using the measurement unit upon turning ON one of the plurality of first switches constituting the switch group.

(9) The plasma processing method according to the above (8), further including:

switching the connection destination of the switch group to the power supply and turning ON all of the plurality of first switches constituting the switch group, in which the switching the connection destination of the switch group to the power supply is executed, followed by the switching the connection destination of the switch group to the measurement unit and the measuring.

(10) The plasma processing method according to the above (8) or (9), further including:

calculating a self-bias voltage for a region in a substrate support corresponding to one of the plurality of first switches based on the voltage measured in the measuring.

According to the present disclosure, it is possible to measure the in-plane distribution of the self-bias voltage of a substrate support.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:

a plasma processing chamber;

a base disposed in the plasma processing chamber;

an electrostatic chuck disposed on top of the base;

a plurality of electrode layers disposed in a same plane within the electrostatic chuck;

a switch group including a plurality of first switches electrically connected to the plurality of electrode layers, respectively;

a power supply and a gauge that are electrically connected to the switch group, a second switch configured to select either the power supply or the gauge as a connection destination of the switch group; and a controller, wherein the power supply includes a power source that supplies a power to the plurality of electrode layers, the gauge includes a resistor and a voltmeter that measures a voltage applied to the resistor, and the controller is configured to execute a control operation that includes switching the connection destination of the switch group to the gauge and then turning ON the plurality of first switches constituting the switch group one by one.

2. The plasma processing apparatus according to claim 1, wherein the gauge includes a capacitor disposed between the power supply and the switch group.

3. The plasma processing apparatus according to claim 1, wherein the electrode a layers are heater electrode layers.

4. The plasma processing apparatus according to claim 1, wherein the electrostatic chuck further includes a clamping electrode layer, and the electrode layers are disposed on top of the clamping electrode layer.

5. The plasma processing apparatus according to claim 1, wherein the switch group is disposed inside the base.

6. The plasma processing apparatus according to claim 2, wherein the capacitor constitutes an RF filter.

7. The plasma processing apparatus according to claim 1, wherein the controller is configured to execute a control operation that includes switching the connection destination of the switch group to the power supply and turning ON all of the plurality of first switches constituting the switch group, followed by switching the connection destination of the switch group to the gauge and then turning ON the plurality of first switches one by one.

8. A plasma processing method comprising:

providing a plasma processing apparatus including:

a plasma processing chamber;

a base disposed in the plasma processing chamber;

an electrostatic chuck disposed on top of the base;

a plurality of electrode layers disposed in a same plane within the electrostatic chuck;

a switch group including a plurality of first switches electrically connected to the plurality of electrode layers, respectively;

a power supply and a gauge that are electrically connected to the switch group, the power supply including a power source that supplies a power to the plurality of electrode layers, and the gauge including a resistor and a voltmeter that measures a voltage applied to the resistor;

a second switch configured to select either the power supply or the gauge as a connection destination of the switch group; and a controller;

switching the connection destination of the switch group to the gauge and then turning ON the plurality of first switches constituting the switch group one by one; and measuring the voltage using the gauge upon turning ON one of the plurality of first switches constituting the switch group.

9. The plasma processing method according to claim 8, further comprising:

switching the connection destination of the switch group to the power supply and turning ON all of the plurality of first switches constituting the switch group, wherein the switching the connection destination of the switch group to the power supply is executed, followed by the switching the connection destination of the switch group to the gauge and the measuring.

10. The plasma processing method according to claim 8, further comprising:

calculating a self-bias voltage for a region in a substrate support corresponding to one of the plurality of first switches, based on the voltage measured in the measuring.

* * * * *